United States Patent
Maxwell et al.

(10) Patent No.: US 7,236,368 B2
(45) Date of Patent: Jun. 26, 2007

(54) INTEGRAL MOLDED HEAT SINKS ON DC-DC CONVERTERS AND POWER SUPPLIES

(75) Inventors: John A. Maxwell, Newbury Park, CA (US); William T. Yeates, Thousand Oaks, CA (US)

(73) Assignee: Power-One, Inc., Camarillo, CA (US)

( * ) Notice: Subject to any disclaimer, the term of this patent is extended or adjusted under 35 U.S.C. 154(b) by 235 days.

(21) Appl. No.: 11/044,870

(22) Filed: Jan. 26, 2005

(65) Prior Publication Data

US 2006/0164811 A1   Jul. 27, 2006

(51) Int. Cl.
*H05K 7/20*   (2006.01)
(52) U.S. Cl. ............... 361/719; 361/704; 361/710; 361/714; 257/659; 257/722; 174/15.2
(58) Field of Classification Search ........ 361/704–710, 361/712–722, 748–749, 760–764, 775, 784, 361/788–789, 792; 257/706–707, 712–713, 257/780–783, 734, 792–796; 307/43; 303/141; 363/65–68, 69–71; 165/104.33, 185, 80.3; 264/104, 105, 254–255, 328.7, 328.8, 328.18; 174/15.2
See application file for complete search history.

(56) References Cited

U.S. PATENT DOCUMENTS

| | | | | |
|---|---|---|---|---|
| 3,564,109 A | * | 2/1971 | Ruchardt | 174/15.2 |
| 5,155,579 A | * | 10/1992 | AuYeung | 257/722 |
| 5,371,404 A | * | 12/1994 | Juskey et al. | 257/659 |
| 5,895,229 A | * | 4/1999 | Carney et al. | 438/106 |
| 5,930,112 A | * | 7/1999 | Babinski et al. | 361/695 |
| 5,945,746 A | * | 8/1999 | Tracewell et al. | 307/43 |
| 6,175,500 B1 | | 1/2001 | Roy | |
| 6,407,923 B1 | * | 6/2002 | Gerlock et al. | 361/704 |
| 6,577,504 B1 | | 6/2003 | Lofland et al. | |
| 6,731,523 B2 | * | 5/2004 | Jitaru | 363/65 |
| 6,756,005 B2 | * | 6/2004 | Panek et al. | 264/255 |
| 6,947,287 B1 | * | 9/2005 | Zansky et al. | 361/731 |
| 6,952,347 B2 | * | 10/2005 | Baeumel et al. | 361/710 |
| 7,057,896 B2 | * | 6/2006 | Matsuo et al. | 361/704 |
| 2004/0217472 A1 | * | 11/2004 | Aisenbrey et al. | 257/734 |

* cited by examiner

*Primary Examiner*—Michael Datskovskiy
(74) *Attorney, Agent, or Firm*—Robert D. Atkins; Quarles & Brady LLP

(57) ABSTRACT

A power supply module has a printed circuit board (PCB) containing a plurality of electrical components for converting an input voltage to an output voltage. A heat sink is formed over substantially an entire surface area of the PCB for providing heat dissipation. The heat sink is made with a thermally conductive and electrically insulating polymer compound, such as liquid crystalline polymer or polyphenylene sulfide, which is injection molded to surface of the PCB. The heat sink can be formed on a front side and backside of the PCB and may have a plurality of posts for increasing the heat dissipating surface area of the heat sink. By disposing the heat sink over substantially the entire surface of the PCB, the heat sink is able to remove more heat and allow the power supply module to provide more output load current given the same physical size and ambient conditions.

7 Claims, 5 Drawing Sheets

INTEGRAL MOLDED HEAT SINKS ON DC-DC CONVERTERS AND POWER SUPPLIES

FIELD OF THE INVENTION

The present invention relates in general to electronic power supplies and, more particularly, to an integral molded heat sink on a DC-DC converter or other power supply.

BACKGROUND OF THE INVENTION

Most modern electronic equipment requires a power supply to provide a direct current (DC) operating potential to the electronic components contained therein. Common types of electronic equipment which use power supplies include personal computers, energy systems, telecommunication systems, audio-video equipment, consumer electronics, automotive components, and other devices which utilize integrated circuits, semiconductor chips, or otherwise require DC operating potential. Most, if not all, semiconductor components require a low voltage DC operating potential. However, many sources of electric power are alternating current (AC), or high voltage DC, which must be converted to low voltage DC for the electronic equipment.

In one common arrangement, the AC/DC power supply receives an AC input voltage, e.g., between 110 and 240 VAC, and converts the AC input voltage to the DC operating voltage. The AC voltage is routed through a full-wave rectifier bridge and filtered to produce a high voltage DC signal. The high voltage DC signal is processed through a pulse width modulated (PWM) controller and transformer assembly to generate the low voltage, regulated DC output voltage, which is used as the operating potential for the semiconductor components and other devices requiring low voltage DC supply in the electronic equipment. The low voltage DC signal is typically in the range of 1 to 12 VDC. In other cases, a DC/DC power supply receives a high voltage DC signal and provides the low voltage DC signal necessary for the electronic equipment.

Power supplies are well-known to generate heat during normal operation. The energy transfer process across the transformer as well as switching losses in the power transistor are primary sources of the heat generation in power converters. In an effort to dissipate the heat, power supply manufacturers have mechanically attached heat sinks on individual components, e.g. pressure fit metal fins on the power transistor package, and utilized cooling fans to increase air flow across the unit. The heat sink increases the surface area of the heat generating device. The cooling fan increases air flow across the surface area of the heat generating device to dissipate the heat into the surrounding air.

As electronic equipment increase in functionality, there is less room for overhead functions like power supplies. This is particular true in telecommunication systems. The original equipment manufacturers (OEMs) demand more power from dimensionally smaller power supplies, or power supplies which at least are not proportionally larger. The heat generation is one factor limiting the operational parameters and power rating which can be achieved with conventional power converters.

A need exists for a power supply having a higher power rating without increasing its feature size or ambient operating temperature.

SUMMARY OF THE INVENTION

In one embodiment, the present invention is a power supply module comprising a printed circuit board having a plurality of electrical components mounted thereon for converting an input voltage to an output voltage. A heat sink is formed over substantially an entire surface area of the printed circuit board for providing heat dissipation.

In another embodiment, the present invention is a power supply module comprising a printed circuit board having a plurality of electrical components mounted thereon for converting an input voltage to an output voltage. An overmolded polymer compound is formed over at least a portion of the printed circuit board for providing heat dissipation.

In another embodiment, the present invention is a power supply comprising a chassis and a plurality of power supply modules mounted within the chassis. Each power supply module receives an input voltage and generates an output voltage. A heat sink is formed over the power supply modules for providing heat dissipation.

In another embodiment, the present invention is a method of dissipating heat from a power supply module comprising providing a printed circuit board having a plurality of electrical components mounted thereon for converting an input voltage to an output voltage, and forming a heat sink over the printed circuit board for providing heat dissipation.

In another embodiment, the present invention is a method of forming a heat sink on a power supply module comprising providing a power supply module, and depositing a thermally conductive polymer compound onto a surface of the power supply module.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
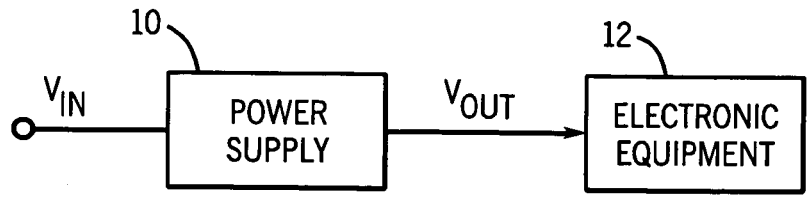
FIG. 1 illustrates a modular power supply providing DC potential to electronic equipment.

Referring to FIG. 1, a modular power supply 10 is shown providing a DC operating potential to electronic equipment 12. Power supply 10 receives input voltage $V_{IN}$ and produces one or more DC output voltages. The electronic equipment 12 may take the form of personal computers, energy systems, telecommunication systems, audio-video equipment, consumer electronics, automotive components, and other devices which utilize integrated circuits, semiconductor chips, or otherwise require DC operating potential from the power supply.

Figure 2:
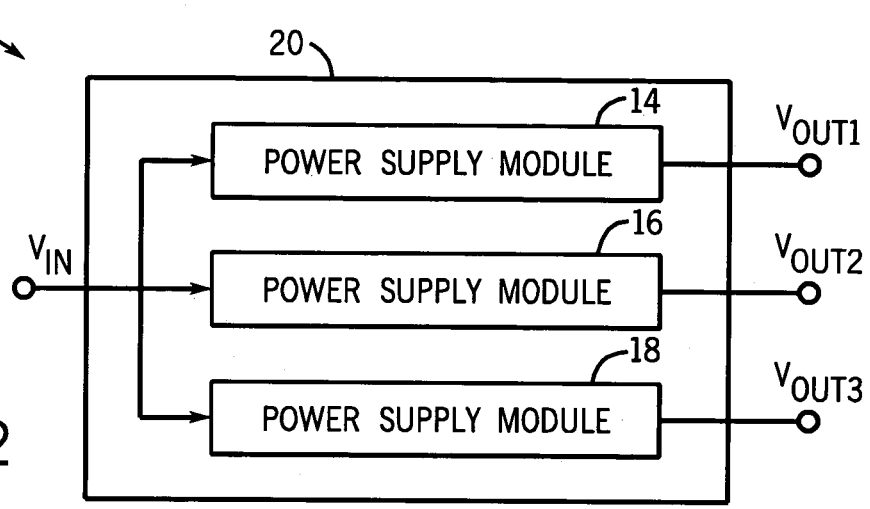
FIG. 2 illustrates the modular power supply.

Further detail of modular power supply 10 is shown in FIG. 2. In many cases, electronic equipment 12 requires multiple operating voltages. Accordingly, power supply 10 includes multiple galvanic isolated power supply modules 14, 16, and 18, each generating a different DC voltage. The power supply 10 may also use non-isolated DC—DC power supply modules. The power supply modules 14–18 receive the input voltage $V_{IN}$ and provide DC output voltages $V_{OUT1}$, $V_{OUT2}$, and $V_{OUT3}$, respectively, to electronic equipment 12. In one embodiment, power supply module 14 generates an output voltage $V_{OUT1}$ of 5.0 volts DC (VDC); power supply module 16 generates an output voltage $V_{OUT2}$ of 7.5 VDC; and power supply module 18 generates an output voltage $V_{OUT3}$ of 12 VDC. Power supply modules 14–18 are contained with power supply chassis 20, which may be mounted to electronic equipment 12 as a through hole mounting or surface mount attachment. The power supply chassis 20 may be provided as a separate assembly in close proximity to electronic equipment 12.

Figure 3:
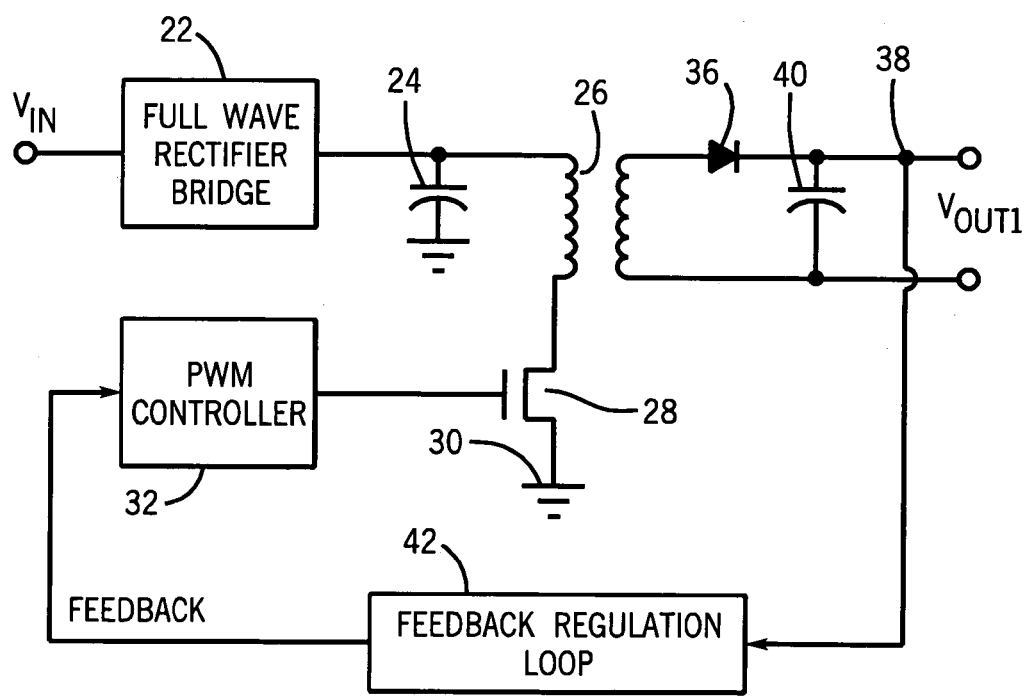
FIG. 3 is a block diagram of one power supply module.

Further detail of power supply module 14 is shown in FIG. 3. The following embodiment of power supply module 14 represents one power conversion process. Other power conversion topologies are within the scope of the present invention. The input voltage $V_{IN}$ may be an alternating current (AC) signal, e.g., 110 VAC, or direct current (DC) signal, e.g., 48 volts. For the case of an AC input voltage, power supply module 14 has a full-wave rectifier bridge 22. The full-wave rectifier bridge 22 converts the AC input voltage to a DC voltage. In the case of a DC input voltage, the full-wave rectifier bridge 22 is omitted. Capacitor 24 smoothes and filters the DC voltage. The DC voltage is applied to a primary side of transformer 26. The primary side of transformer 26 is also coupled through power transistor 28 to ground terminal 30. In one embodiment, power transistor 28 is a metal oxide semiconductor field effect transistor (MOSFET). The gate of MOSFET 28 receives a pulse width modulated (PWM) control signal from PWM controller 32. The secondary side of transformer 26 is coupled to rectifier diode 36 to create the DC output voltage $V_{OUT1}$ of power supply module 14 at node 38. Capacitor 40 filters the DC output voltage $V_{OUT1}$.

The DC output voltage $V_{OUT1}$ is routed back through feedback regulation loop 42 to a control input of PWM controller 32. The DC output voltage $V_{OUT1}$ generates the feedback signal which PWM controller 32 uses to regulate the power conversion process and maintain a relatively constant output voltage $V_{OUT1}$ under changing loads. The aforedescribed electrical components of the power supply module are mounted to and electrically interconnected through a printed circuit board.

In the power conversion process, PWM controller 32 sets the conduction time duty cycle of MOSFET 28 to store energy in the primary side of transformer 26 and then transfer the stored energy to the secondary side during the off-time of MOSFET 28. The output voltage $V_{OUT1}$ is determined by the energy transfer between the primary and secondary side of transformer 26. The energy transfer is regulated by PWM controller 32 via the duty cycle of the PWM control signal to MOSFET 28. Feedback regulation loop 42 generates the feedback signal to PWM controller 32 in response to the output voltage $V_{OUT1}$ to set the conduction time duty cycle of MOSFET 28.

Consider the case where the load increases from zero to some nominal value. As load increases, the output current demand from power supply module 14 increases and the output voltage $V_{OUT1}$ decreases. As the lower output voltage causes the feedback signal to be asserted for a longer time within the control cycle, which in turn causes PWM controller 32 to increase the pulse width to the power MOSFET 28. The longer conduction time of the power MOSFET 28 stores more energy in the primary side of transformer 26. Accordingly, more energy is transferred to the secondary side of transformer 26 during the off-time of the power MOSFET. The output voltage $V_{OUT1}$ of power supply module 14 increases to compensate for the increased current demand. Power supply modules 16 and 18 may follow a similar design and operation.

Power supply 10 is constructed to meet the maximum power requirement of electronic equipment 12. The power supply requirements of electronic equipment 12 continue to grow with increasing equipment functionality. The designers of electronic equipment 12 continue to add more features and increase the speed of their equipment, which often takes more space and consumes more power. In order to supply the power demands of electronic equipment 12, the power supply modules within power supply 10 necessarily generate heat. The transformer 26, power MOSFET 28, and PWM controller 32 are primarily sources of the heat generated from power supply modules 14–18. However, more power usually involves larger components, more heat dissipation, and more printed circuit board area for the power supply module to dissipate the heat. Yet, because of the growing number and size of functional components within electronic equipment 12, equipment manufacturers also demand smaller overall feature size in the requisite power supplies.

Figure 4:
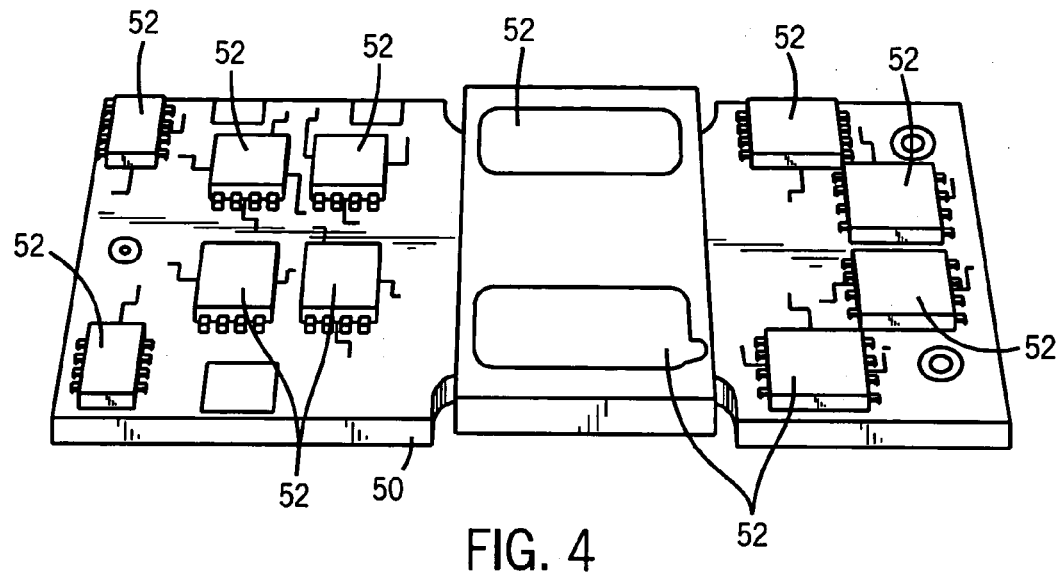
FIG. 4 is a top view of a horizontal power supply module.

In FIG. 4, the aforedescribed electric circuit components of power supply module 14 are mounted to the top side of printed circuit board (PCB) 50, which provides structure support, electrical interconnect, and heat dissipation medium. The PCB is typically designed to act as a heat spreader to distribute the heat over a wider surface area. Electrical components 52 are soldered or otherwise electrically connected to PCB 50. The electrical components 52 include active and passive devices such as transformer 26, power MOSFET 28, PWM controller 32, diode 36, capacitors 24 and 40, and feedback regulation loop 42.

Figure 5:
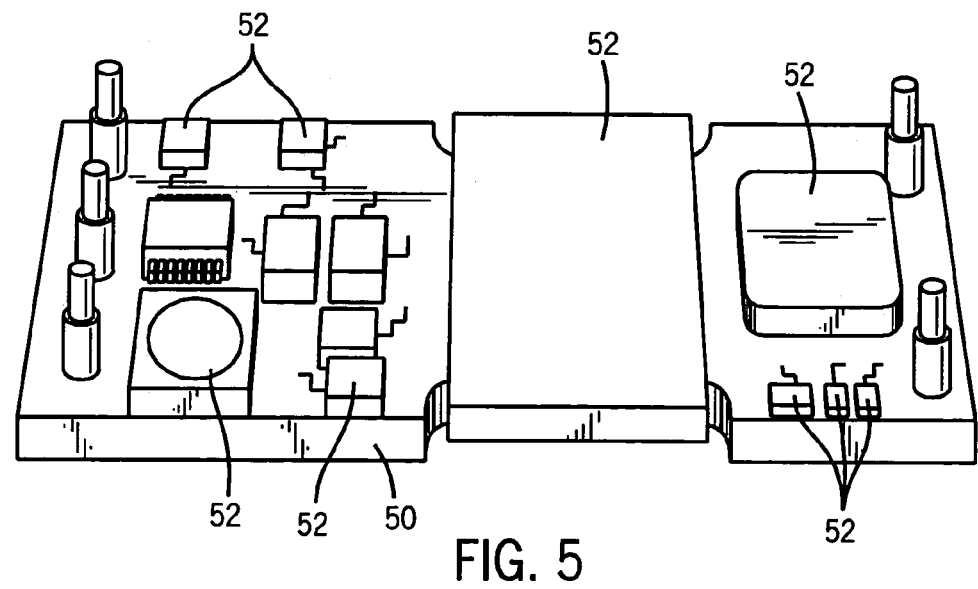
FIG. 5 is a bottom view of the horizontal power supply module.

FIG. 5 shows more electrical components 52 mounted to the backside of PCB 50. The electrical components 52 on the top side and backside of PCB 50 are electrically connected to perform the power conversion function of power supply module 14. Some electrical components are surface mounted to the PCB.

As a feature of the present invention, power supply module 14 is overmolded with heat dissipating polymer compound to act as a heat sink for the print circuit board as a whole. The polymer compound is thermally conductive, electrically insulating, and covers substantially the entire surface area of PCB 50. The overmolded polymer compound is in intimate contact with the PCB 50 and electrical components 52, which allows the compound to operate as a thermal conductor to extract heat from the electrical components on the PCB and from substantially the entire surface area of the PCB itself.

Figure 6:
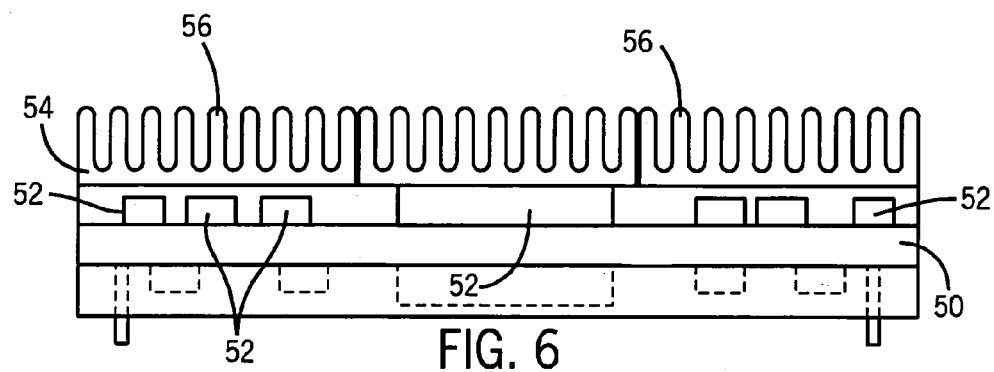
FIG. 6 is a cross-sectional view of the horizontal power supply module having overmolded heat sink with posts.
Figure 7:
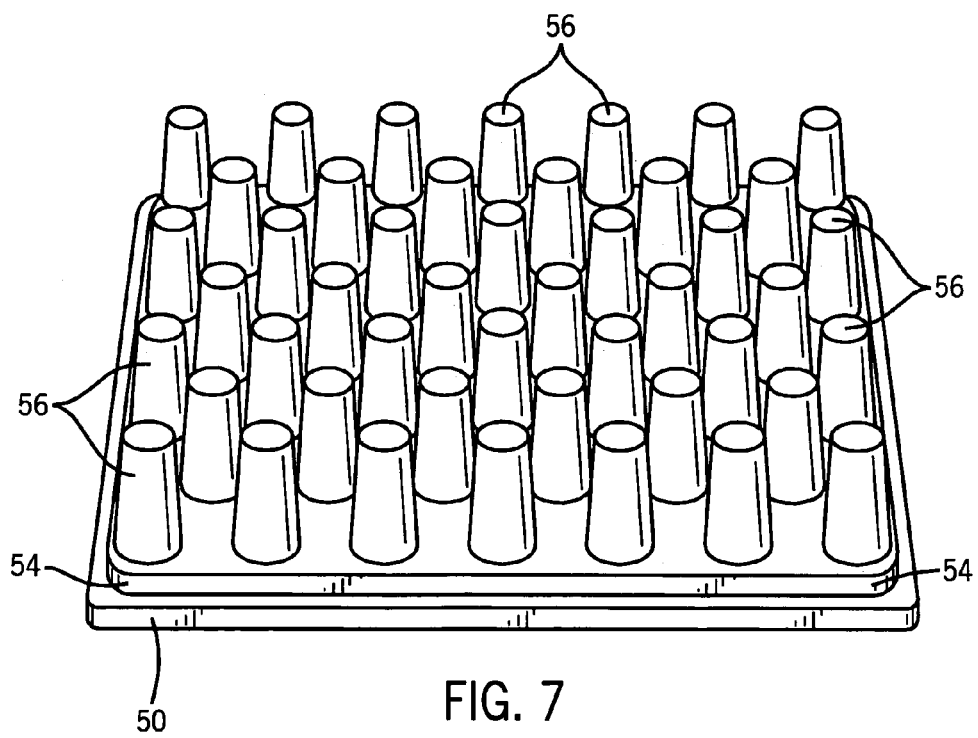
FIG. 7 illustrates the horizontal power supply module from FIG. 4 having overmolded heat sink with posts.

A cross-sectional side view of power supply module 14 is shown in FIG. 6 with heat sink 54 overmolded on PCB 50. The integral overmolded heat sink 54 is formed over substantially the entire top surface of PCB 50 and electrical components 52. The heat sink 54 is formed with a thermally conductive and electrically insulating polymer compound. Ordinarily, the electrical connectors, test points, pin-outs, and other metal contact points would be void of the overmolding polymer compound. In one embodiment, the overmolded heat sink 54 may be formed with fins or posts 56 that increase the surface area of the heat sink. The heat sink posts 56 can be formed with a variety of heights, cross-sectional areas, density, shapes, and patterns. For example, the posts are relatively short, thin, and densely packed in FIG. 6. In FIG. 7, the heat sink posts 56 are relatively larger, cylindrical in shape, and formed in adjacent rows offset in an alternating pattern. The posts 56 in FIG. 7 are 2.0 millimeters (mm) in diameter and 2.5 mm in height.

Figure 8:
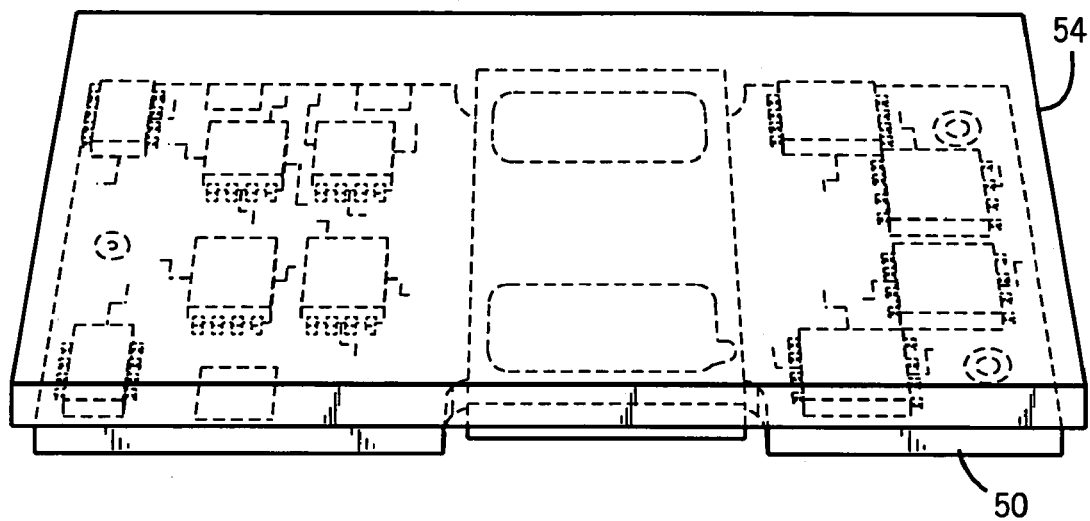
FIG. 8 illustrates the horizontal power supply module from FIG. 4 having overmolded heat sink without posts.
Figure 9:
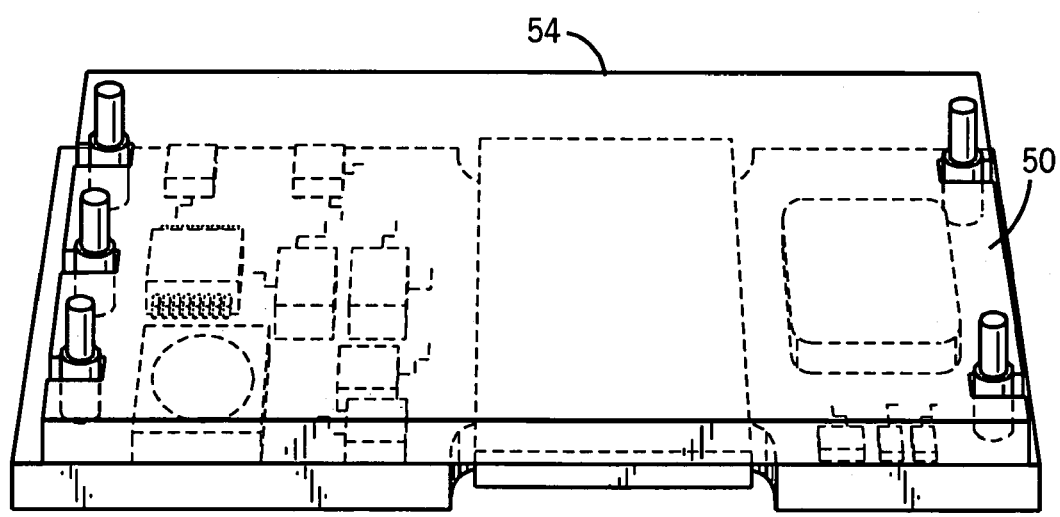
FIG. 9 illustrates the horizontal power supply module from FIG. 5 having overmolded heat sink.

In another embodiment, formed without the fins or posts, the overmolded heat sink 54 has a relatively flat surface. Alternatively, the overmolded polymer compound may have a uniform thickness and conform to the outline or shape of the electrical components 52. FIG. 8 illustrates the heat sink 54 molded to the top surface of PCB 50. FIG. 9 illustrates the overmolding polymer compound applied to the backside of PCB 50. The overmolding polymer compound may be applied to the front side and/or backside of PCB 50 depending on the most effective coverage to dissipate the heat. In both cases, heat sink 54 will have a thickness over the PCB and electrical components, and may have a flat surface, or may follow the physical contour of the component populated PCB.

In another embodiment, the overmolded heat sink can also be formed over only portion(s) of the PCB and electrical components 52 which generate the most heat, i.e. the hot spots. For example, the overmolded heat sink 54 may be formed over the area(s) of PCB 50 containing transformer 26 and power MOSFET 28. The overmolding polymer compound would cover the heat generating electric components and some portion of the PCB in proximity to the heat generating electric components. The heat sink over the hot spots can be formed with fins or posts.

Figure 10:
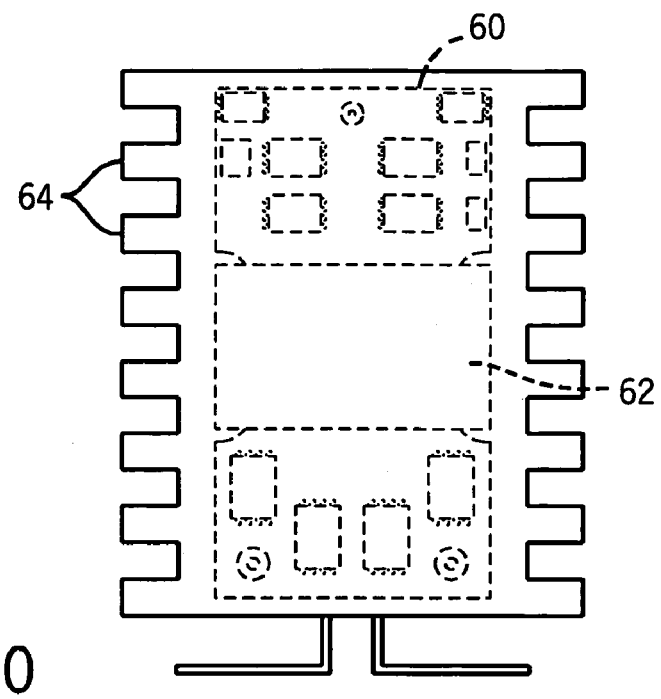
FIG. 10 illustrates a vertical power supply module having overmolded heat sink with fins.

The PCBs with overmolded heat sinks shown in FIGS. 6–9 are intended for horizontal orientation when mounting to power supply chassis 20. A vertically oriented PCB 60 is shown in FIG. 10. PCB 60 includes electrical components for performing the power conversion function of the power supply module as discussed above. The overmolding compound may be applied to front and back sides of PCB 60 to form heat sink 62, with optional fins or posts 64 to increase the surface area of the heat sink. The power supply module with PCB 60 having overmolded heat sink 62 is intended for vertically oriented mounting in power supply chassis 20.

The overmolded polymer compound can be formed into heat sink 54 using an injection molding process. The polymer compound is a thermally conductive and electrically insulating material. Examples of a suitable polymer material include liquid crystalline polymer (LCP) available from Cool Polymer as part number D5502, and polyphenylene sulfide (PPS) available from Cool Polymer as part numbers D5104, D5106, and D5108. The LCP and PPS material may be filled with a ceramic, usually boron nitride. The thermal conductivity of such polymer materials are in the range of 1.5–10 W/mK. The electrical resistivity ranges from $10^{13}$ to $10^{16}$ ohm-cm and the dielectric strength ranges from 35–560 kV/mm.

Figure 11:
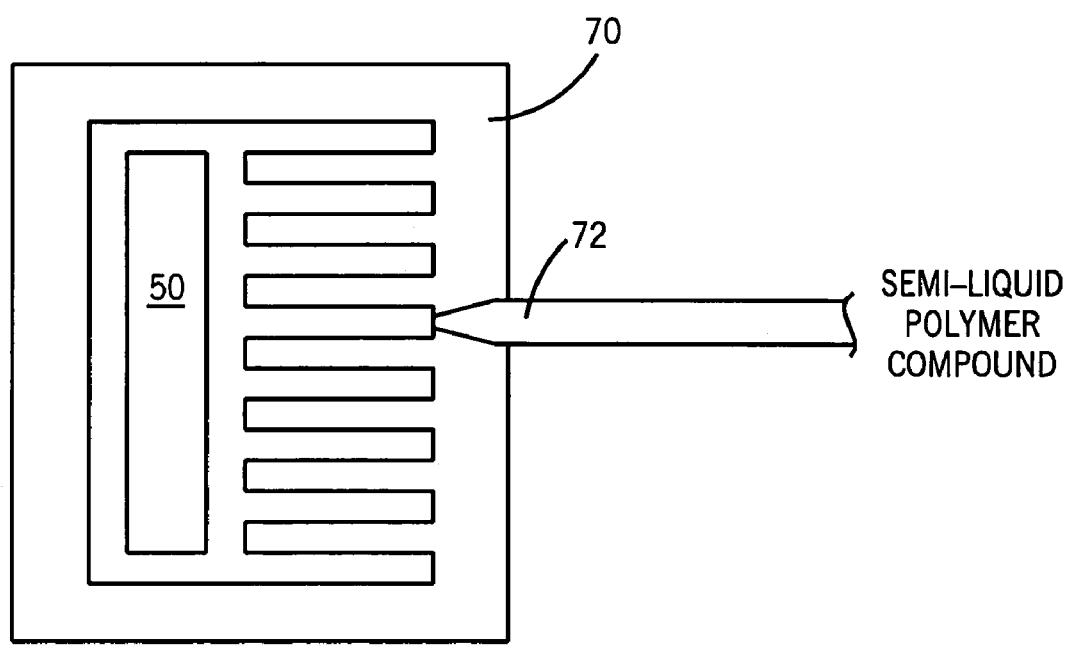
FIG. 11 illustrates a thermoplastic injection mold with nozzle for delivering semi-liquid polymer compound.

The base polymer material comes in pellet form, which can be loaded into a thermoplastic injection molding apparatus. Power supply module 14 embodied as PCB 50 is placed within the cavity of mold 70. The cavity is formed to the shape of heat sink 54, including fins or posts 56 if desired. The pellets are melted and injected in semi-liquid state to a pre-formed mold 70 such as shown in FIG. 11. The semi-liquid polymer material is extruded through nozzle 72 into mold 70 and deposited onto PCB 50. Depending on the form of the mold, the polymer material may encapsulate the PCB. The overmolding polymer compound, as injected into mold 70, forms heat sink 54 on PCB 50. The polymer compound is then cured to form overmolded heat sink 54 on the surface of PCB 50.

In another embodiment, the polymer compound can be deposited onto the surfaces of PCB 50 as a spray. The PCB may also be dipped into a polymer bath. In such cases, the polymer compound will create a heat sink of uniform thickness over the electrical components and PCB.

The horizontal or vertical mounted PCBs with overmolded heat sinks are mounted within power supply chassis 20. The heat generated is thermally conducted away from the PCB and the electrical components through the overmolded heat sink. A fan circulates air over the heat sink to further dissipate the heat into surrounding air space.

The overmolded heat sink 54 on PCB 50 provides a number of advantages. The overmolded polymer compound is in direct contact with substantially the entire surface of PCB 50 and electrical components 52 and operates as an effective thermal conductor to extract heat from the electrical components on the PCB and from the PCB itself in an efficient manner. The heat generated by PCB 50 during the power conversion process is dissipated through the heat sink, which is in direct and continuous contact with the printed circuit board and electric components. By having the heat sink disposed over substantially the entire surface of PCB 50 and electrical components 52, or at least over the electrical components generating the most heat, the heat sink is able to remove more heat from the power supply module. Accordingly, the power supply module can provide more output load current given the same physical size of electrical components and PCB, and same ambient operating temperature.

While one or more embodiments of the present invention have been illustrated in detail, the skilled artisan will appreciate that modifications and adaptations to those embodiments may be made without departing from the scope of the present invention as set forth in the following claims.

What is claimed is:

1. A power supply module, comprising:
   a printed circuit board having a plurality of electrical components mounted on a front surface and back surface of the printed circuit board for converting an input voltage to an output voltage, the printed circuit board further having at least one electrical connector, test point, pin-out, and metal contact point; and
   a heat sink formed with a thermally conductive and electrically insulating polymer compound covering substantially an entire area of the front surface and back surface of the printed circuit board for providing heat dissipation, the heat sink on the front and back surfaces of the printed circuit board being formed to follow a physical contour of the electrical components mounted thereon, the heat sink further including a plurality of fins extending outwardly on either side of and in a same plane as the front and back surfaces of the printed circuit board, wherein only the electrical connector, test point, pin-out, and metal contact point of the front surface and back surface of the printed circuit board are devoid of the polymer compound.

2. The power supply module of claim 1, wherein the polymer compound is made of liquid crystalline polymer or polyphenylene sulfide.

3. A power supply module, comprising:
a printed circuit board having a plurality of electrical components mounted on a front surface and back surface of the printed circuit board for converting an input voltage to an output voltage, the electrical components including a transformer and power MOSFET mounted on the front surface of the printed circuit board, the printed circuit board further having at least one electrical connector, test point, pin-out, and metal contact point; and
a heat sink formed with a thermally conductive and electrically insulating polymer compound for providing heat dissipation, the heat sink on the front surface of the printed circuit board consisting of a plurality of cylindrical posts arranged in adjacent rows offset in an alternating pattern covering only the transformer and power MOSFET and a portion of the printed circuit board proximate to the transformer and power MOSFET, each cylindrical post measuring about 2.0 mm in diameter and 2.5 mm in height, the heat sink on the back surface of the printed circuit board covering substantially its entire area as a conforming layer following a physical contour of the electrical components mounted thereon, the electrical connector, test point, pin-out, and metal contact point of the front surface and back surface of the printed circuit board being devoid of the polymer compound.

4. The power supply module of claim 3, wherein the polymer compound is made of liquid crystalline polymer or polyphenylene sulfide.

5. A power supply, comprising:
a chassis;
a plurality of power supply modules mounted within the chassis, wherein each power supply module receives an input voltage and generates an output voltage, each power supply module including a printed circuit board having a plurality of electrical components mounted on a front surface and back surface of the printed circuit board for converting an input voltage to an output voltage, the printed circuit board further having at least one electrical connector, test point, pin-out, and metal contact point; and
a heat sink formed over one or more of the power supply modules for providing heat dissipation, the heat sink being formed with a thermally conductive and electrically insulating polymer compound covering substantially an entire area of the front surface and back surface of the printed circuit board for providing heat dissipation, the heat sink on the front surface of the printed circuit board being formed as a plurality of fins extending outwardly on either side of and in a same plane as the front surface of the printed circuit board, the heat sink on the back surface of the printed circuit board being formed to follow a physical contour of the electrical components mounted thereon, wherein only the electrical connector, test point, pin-out, and metal contact point of the front surface and back surface of the printed circuit board are devoid of the polymer compound.

6. The power supply module of claim 5, wherein the polymer compound is made of liquid crystalline polymer or polyphenylene sulfide.

7. A method of dissipating heat from a power supply module, comprising:
providing a printed circuit board having a plurality of electrical components mounted on a front surface and back surface of the printed circuit board for converting an input voltage to an output voltage, the printed circuit board further having at least one electrical connector, test point, pin-out, and metal contact point; and
forming a heat sink over the printed circuit board for providing heat dissipation, the heat sink being formed with a thermally conductive and electrically insulating polymer compound covering substantially an entire area of the front surface and back surface of the printed circuit board for providing heat dissipation, the heat sink on the front surface of the printed circuit board being formed as a plurality of fins, the heat sink on the back surface of the printed circuit board being formed to follow a physical contour of the electrical components mounted thereon, the electrical connector, test point, pin-out, and metal contact point of the front surface and back surface of the printed circuit board being devoid of the polymer compound.

* * * * *